United States Patent [19]

Prabhu et al.

[11] 4,415,624

[45] Nov. 15, 1983

[54] AIR-FIREABLE THICK FILM INKS

[75] Inventors: Ashok N. Prabhu, Plainsboro; Kenneth W. Hang, Princeton Junction, both of N.J.

[73] Assignee: RCA Corporation, New York, N.Y.

[21] Appl. No.: 455,310

[22] Filed: Jan. 3, 1983

Related U.S. Application Data

[63] Continuation-in-part of Ser. No. 280,936, Jul. 6, 1981, abandoned.

[51] Int. Cl.$^3$ .......................... B32B 3/10; H01B 1/02
[52] U.S. Cl. ...................................... 428/209; 252/512; 252/518; 252/519; 338/308; 427/96; 427/101; 427/102; 427/126.2; 427/126.3; 427/123; 428/210; 428/427; 428/428; 428/432; 428/433; 428/434; 428/471; 428/472; 428/701; 428/901
[58] Field of Search ............... 252/519, 514, 512, 511; 428/432, 433, 209, 210, 901, 428, 427, 472, 471, 701, 901; 427/126.2, 126.3, 123, 96, 101, 102; 338/308

[56] References Cited

U.S. PATENT DOCUMENTS

| | | | |
|---|---|---|---|
| 3,304,199 | 2/1967 | Faber et al. | 117/201 |
| 3,484,284 | 12/1969 | Dates et al. | 117/221 |
| 3,673,117 | 6/1972 | Schroeder et al. | 252/512 |
| 3,776,772 | 12/1973 | Asada et al. | 117/227 |
| 3,827,891 | 8/1974 | Larry | 106/1 |
| 3,838,071 | 9/1974 | Amin | 252/514 |
| 4,029,605 | 6/1977 | Kosiorek | 252/514 |
| 4,051,074 | 9/1977 | Asada | 252/503 |
| 4,141,727 | 2/1979 | Shida et al. | 75/232 |
| 4,172,922 | 10/1979 | Merz et al. | 428/432 |
| 4,204,863 | 5/1980 | Schreiner | 75/234 |
| 4,215,020 | 7/1980 | Wahlers et al. | 252/519 |
| 4,230,493 | 10/1980 | Felten | 106/1.13 |
| 4,256,796 | 3/1981 | Hang et al. | 428/210 |
| 4,286,251 | 8/1981 | Howell | 338/309 |
| 4,318,830 | 3/1982 | Horowitz | 252/519 |

*Primary Examiner*—Ellis P. Robinson
*Attorney, Agent, or Firm*—Birgit E. Morris; R. Hain Swope

[57] ABSTRACT

Improved air-fireable resistor and conductor inks useful in constructing multilayer integrated circuits on porcelain-coated metal substrates are provided. The subject inks comprise a barium calcium borosilicate glass frit, a suitable organic vehicle, and a functional component, i.e., ruthenium dioxide, in the resistor inks and one or more precious metals plus bismuth oxide in the conductor inks.

24 Claims, No Drawings

AIR-FIREABLE THICK FILM INKS

RELATED APPLICATIONS

This application is a continuation-in-part of U.S. patent application Ser. No. 280,936 filed July 6, 1981 now abandoned.

This invention pertains to air-fireable thick film resistor and conductor inks and their use in multilayer electrical circuit structures on porcelain-coated metal substrates.

BACKGROUND OF THE INVENTION

The use of specialized ink formulations to form thick films having various functions on suitable substrates in the construction of multilayer integrated circuit structures is well known in the art. Such technology is of increasing interest in the fabrication of very dense multilayer circuit patterns on various substrates for a wide variety of applications in the electronics industry.

Significantly improved substrates for the fabrication of such circuits are disclosed and claimed in Hang et al., U.S. Pat. No. 4,256,796, issued Mar. 17, 1981, the disclosure of which is incorporated herein by reference. The Hang el al. substrates are comprised of a metal core coated with an improved porcelain comprised of a mixture, based on its oxide content, of magnesium oxide (MgO) or mixtures of magnesium oxide and certain other oxides, barium oxide (BaO), boron trioxide ($B_2O_3$) and silicon dioxide ($SiO_2$). The preferred metal is steel, particularly low carbon steel, which may be coated with various other metals such as, for example, copper. The porcelain compositions are applied to the metal core and fired to provide a partially devitrified porcelain coating thereon. The coating has a very low viscosity at its initial fusion point and then almost instantaneously obtains a high viscosity due to devitrification. The fired coatings, which are preferred for hybrid circuit applications, have a deformation temperature of at least 700° C. and a high coefficient of thermal expansion of at least about $110 \times 10^{-7}/°C$.

While the porcelain-coated metal substrates of Hang et al. represent a significant improvement over previously known substrate materials, they are disadvantageous only in being incompatible or poorly compatible with commercially available thick-film inks. For example, a resistor ink containing a significant amount of lead oxide, which is conventionally used in air-fireable inks, is a flux for the Hang et al. substrates. During firing, the glass in such an ink will drain to the substrate, pass therein and become diffused throughout to varying concentrations. This leaves the functional particles on the surface in a glass deficient state and substantially changes the makeup and properties of the substrate. The migration of the glass into the substrate produces very low resistance values and substantially increases the possibility that the ink can chip or flake off the surface. The resistance values abruptly decrease because the glass acts as an insulating barrier for the conductive functional ingredient, i.e. ruthenium dioxide. When the glass migrates into the substrate, the functional ingredient particles are drawn closer together without an insulator. This therefore significantly raises conductivity and, conversely, lowers resistance to unacceptably low levels. Air-fireable conductor and resistor inks compatible with the Hang et al. substrates are provided in accordance with this invention.

SUMMARY OF THE INVENTION

Improved air-fireable inks provided in accordance with this invention comprise a barium calcium borosilicate glass, a suitable organic vehicle and a functional component. The functional component in the resistor inks is ruthenium dioxide and in the conductor inks a precious metal in combination with bismuth oxide to improve solderability.

DETAILED DESCRIPTION OF THE INVENTION

In accordance with this invention, there are provided air-fireable resistor and conductor inks of high reliability useful in forming thick-film circuits on porcelain metal circuit boards. The inks of this invention are particularly compatible with the Hang et al. circuit boards, with each other, and with air-fireable inks of other functions specifically formulated for the Hang et al. boards. The economic advantage of producing electronic circuits wherein all inks are fireable in air as opposed to an inert atmosphere such as nitrogen is readily apparent to those skilled in the art.

The novel inks of this invention are comprised of a barium calcium borosilicate glass frit, a suitable organic vehicle, and one or more functional components. In the resistor inks, the functional component is ruthenium dioxide and, if desired, a temperature coefficient of resistance (TCR) modifier. In the conductor inks, the functional component is one or more precious metals and, as a soldering enhancer, bismuth oxide.

The glass frit of the novel inks of this invention is a barium calcium borosilicate glass consisting of, on a weight basis:

(a) from about 40 to about 55 percent of barium oxide;
(b) from about 10 to about 15 percent of calcium oxide;
(c) from about 14 to about 25 percent of boron trioxide; and
(d) from about 13 to about 23 percent of silicon dioxide.

The presence of a minimum of ten percent by weight of calcium oxide in the subject glass frits is necessary in order to prepare an air-fireable ink which does not contain ingredients conventional in air-fireable inks, e.g. lead oxide or zinc oxide, which would be incompatible with the Hang et al. substrates. The subject inks also have an optimum balancing of viscosity and surface tension. The subject glass frits have a high surface tension which is desirable so that the glass recedes from the surface of the functional particles. The subject glass frits also have a low viscosity which is necessary in order that the glass will flow and densify uniformly during firing.

The glass frit comprises from about 1 to about 80 percent by weight of the novel air-fireable inks of this invention. The subject resistor inks preferably contain from about 25 to about 80 percent by weight of the glass frit with from about 50 to about 75 percent, by weight being particularly preferred. The subject conductor inks contain from about 1 to about 15 percent by weight of the glass frit with from about 1 to about 7 percent by weight being particularly preferred.

A preferred glass frit for the resistor inks of this invention consists of, on a weight basis, about 52 percent of barium oxide; about 12 percent of calcium oxide; about 16 percent of boron trioxide; and about 20 percent of silicon dioxide. A preferred glass frit for the subject conductor inks consists of, on a weight basis, about 52 percent of barium oxide, about 12 percent of calcium oxide, about 19 percent of boron trioxide, and about 17 percent of silicon dioxide.

The functional component, i.e. ruthenium dioxide or precious metal, of the subject air-fireable inks is present in from about 2 to about 90 percent by weight. The subject resistor inks contain from about 2 to about 60 percent, preferably about 5 to about 25 percent, by weight of ruthenium dioxide. The ruthenium dioxide of the subject resistor inks should be of high purity and preferably have a particle size range of from about 0.05 to about 0.2 micrometer.

The subject air-fireable resistor inks may also contain up to about 10 percent by weight of a conventional TCR modifier such as, for example, manganese dioxide, cadmium oxide, cuprous oxide, and the like.

The term "precious metal" as utilized in this invention indicates one or more art-recognized metals such as for example, gold, silver, platinum, palladium, rhodium, and the like. Combinations of the metals conventionally utilized in conductor inks such as, for example, silver/platinum, gold/platinum, silver/platinum/palladium, and the like are contemplated. All are utilized in pure form with the exception of rhodium which may also be utilized in the form of commercially available resinates. The precious metal comprises from about 60 to about 90 percent, preferably from about 70 to about 85 percent, by weight of the subject conductor inks.

The conductor inks of this invention contain, as a solderability enhancer, from about 1 to about 15 percent, preferably from about 1 to about 7 percent, by weight of bismuth oxide, which may be present either as an additional powder component or as part of the glass frit. The bismuth oxide and the glass frit are preferably present in the subject conductor inks in a weight ratio of from about 1:3 to 3:1, most preferably in equal quantities.

The subject conductor inks optionally contain a small quantity, i.e., up to about 1 percent by weight, of a suitable oxidizing agent. The function of this additive is to provide a source of oxygen and oxidizing vapors as an aid in removing the organic vehicle during firing. A preferred oxidizing agent is bismuth nitrate pentahydrate which is effective over a broad temperature range, in contrast to oxidizing agents which decompose at a specific temperature causing an undesirable abrupt release of gas.

The organic vehicles of the subject inks are binders such as, for example, cellulose derivatives, particularly ethyl cellulose, synthetic resins such as polyacrylates or methacrylates, polyesters, polyolefins, and the like. In general, conventional vehicles utilized in inks of the type described herein may be used in the subject inks. Preferred commercially available vehicles include, for example, pure liquid polybutenes available as Amoco H-25, Amoco H-50 and Amoco L-100 from Amoco Chemicals Corporation, poly(n-butylmethacrylate) available from E. I. duPont deNemours and Co., and the like.

The above resins may be utilized individually or in any combination of two or more. A suitable viscosity modifier can be added to the resin material if desired. These modifiers can be solvents such as those conventionally used in similar ink compositions, e.g., pine oil, terpineol, butyl carbitol acetate, an ester alcohol available from Texas Eastman Company under the trademark Texanol and the like, or solid materials such as, for example, a castor oil derivative available from N & L Industries under the trademark Thixatrol. The organic vehicle comprises from about 8 to about 35 percent by weight of the inks of this invention. The subject resistor inks preferably contain from about 20 to about 30 percent, by weight, of the vehicle. The subject conductor inks preferably contain from about 10 to about 25 percent by weight of the organic vehicle.

The improved air-fireable inks of this invention are applied to a porcelain-coated metal board such as described by Hang et al. by conventional means, i.e., screen, printing, brushing, spraying, and the like, with screen printing being preferred. The coating is then dried in air at 100°-125° C., for about 15 minutes. The resulting film is then fired in air at peak temperatures of from 850°-950° C. for from 4 to 10 minutes. The value of the resistor films can be adjusted by conventional means such as laser trimming or air abrasive trimming.

In addition to the superior compatibility with the Hang et al. substrates and inks formulated therefor, films formed from the resistor inks of this invention have demonstrated very good TCR values, laser trimmability, current noise level, and stability to thermal shock, solder dipping, thermal storage, power loading and humidity. Films formed from the subject conductor inks have shown excellent conductivity, solderability, solder leach resistance, wire bondability and resistance to long term exposure to high humidity.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A gold conductor ink was prepared from the follwng formulation:

| Ingredient | Percent |
|---|---|
| Gold Powder | 83.33 |
| Glass Frit | 1.04 |
| Bismuth Oxide | 1.04 |
| Bismuth Nitrate Pentahydrate | 0.70 |
| Organic Vehicle | 13.89 |

The glass firt had the following composition with percents in parenthesis: BaO (51.32); CaO (12.51); $B_2O_3$ (19.42); and $SiO_2$ (16.75). The organic vehicle comprised, on a percent of the final ink: ethylcellulose (0.58); terpineol (7.90); butyl carbinol acetate (3.23); Texanol (1.84); and Thixatrol (0.34).

Solutions of ethyl cellulose and Thixatrol in the liquid constituents of the vehicle were initially prepared. The vehicle was combined and initially mixed by hand with the combined powder ingredients. The ink was then mixed in a 3 roll mill with shearing to obtain a smooth paste suitable for screen printing. Additional vehicle was added to replace loss during mixing and to assure proper rheology.

The ink was printed on a porcelain-coated steel substrate of the type disclosed by Hang et al. using a 325 mesh stainless steel screen, to a 1.0 mil emulsion thickness. The ink was air dried at 125° for 10 minutes and then fired in air in a belt furnace at a peak temperature of 900° for 4 to 6 minutes at peak temperature. The sheet resistivity of the resulting film was $4.5 \times 10^{-3}$ ohms/square.

EXAMPLE 2

In accordance with the procedure of Example 1, a gold-platinum conductor ink was prepared from the following formulation:

| Ingredient | Percent |
| --- | --- |
| Gold Powder | 67.23 |
| Platinum Powder | 16.81 |
| Glass Frit of Example 1 | 1.26 |
| Bismuth Oxide | 1.26 |
| Bismuth Nitrate Pentahydrate | 0.84 |
| Organic Vehicle | 12.60 |

The organic vehicle consisted of: ethyl cellulose (0.70); terpineol (5.43); butyl carbinol acetate (3.82); Texanol (2.23); and Thixatrol (0.42).

The ink was printed and fired in accordance with the procedure of Example 1 and the resulting film found to have a sheet resistivity of $66 \times 10^{-3}$ ohms/square.

EXAMPLE 3

In accordance with the procedure of Example 1, a silver-palladium conductor ink was prepared from the following formulation:

| Ingredient | Percent |
| --- | --- |
| Silver Powder | 51.09 |
| Palladium Powder | 21.90 |
| Glass Frit of Example 1 | 3.29 |
| Bismuth Oxide | 3.28 |
| Bismuth Nitrate Pentahydrate | 0.73 |
| Organic Vehicle | 19.71 |

The organic vehicle consisted of: ethyl cellulose (0.78); terpineol (17.56); butyl carbinol acetate (1.33) and Thixatrol (0.04).

The ink was printed and fired in accordance with the procedure of Example 1 and the resulting film found to have a sheet resistivity of $58 \times 10^{-3}$ ohms/square.

EXAMPLE 4

In accordance with the procedure of Example 1, a silver-palladium-platinum conductor ink was prepared from the followng formulation:

| Ingredient | Percent |
| --- | --- |
| Silver Powder | 46.80 |
| Palladium Powder | 12.32 |
| Platinum Powder | 7.39 |
| Glass Frit of Example 1 | 6.90 |
| Bismuth Oxide | 6.89 |
| Organic Vehicle | 19.70 |

The organic vehicle consisted of: ethyl cellulose (1.13); terpineol (13.94); butyl carbinol acetate (4.48); and Thixatrol (0.15).

The ink was printed and fired in accordance with the procedure of Example 1 and the resulting film found to have a sheet resistivity of $85 \times 10^{-3}$ ohms/square.

EXAMPLE 5

Ruthenium resistor inks were prepared in accordance with the procedure of Example 1 from the following formulations:

| Formulation | Percent | | |
| --- | --- | --- | --- |
| | $RuO_2$ | Glass Frit | Vehicle |
| A | 21.43 | 50.00 | 28.57 |
| B | 11.54 | 65.38 | 23.08 |
| C | 5.38 | 71.54 | 23.08 |

The glass frit in each instance consisted of: BaO (51.59); CaO (12.58); $B_2O_3$ (15.62); and $SiO_2$ (20.21). The organic vehicle consisted of a 6 percent solution of ethyl cellulose in Texanol.

The inks were screened and fired in air according to the procedure of Example 1. Various conductor terminations were initially applied and fired for the above formulations. The sheet resistivity was determined in each instance and is reported in the following table.

TABLE

| Ink No. | Termination Metal | Termination Formulation | Sheet Resistivity Kilo-ohm per Square |
| --- | --- | --- | --- |
| A | Au | Ex. 1 | 0.107 |
| B | Ag—Pd | Ex. 2 | 11.8 |
| C | Ag—Pd | Ex. 3 | 1273.0 |

The results demonstrate the compatibility of the subject resistors and conductors.

COMPARATIVE EXAMPLE A

Ruthenium resistor inks were prepared in accordance with the method of Example 1 from the following formulation:

| Ingredient | Percent |
| --- | --- |
| Glass Frit | 64.29 |
| $RuO_2$ | 7.14 |
| Vehicle | 28.57 |

The glass frit was a commercial lead borosilicate glass, E-1313 available from Drakenfeld Colors, Coatings and Specialty Products Dept., Hercules, Inc. Washington, PA. The organic vehicles was a 6 percent solution of ethyl cellulose in Texanol. Although the exact formulation of glass E-1313 is not available, it is known that it contains between 50 and 60 percent of lead oxide.

The ink was screened and fired in air according to the procedure of Example 1. Conductor terminations were initially applied and fired. The substrates utilized were a conventional alumina board and the Hang et al. porcelain-coated steel substrate utilized in Example 1. The sheet resistivities were determined to be 214.77 kilo-ohm per square for the alumina substrate and 4.52 for the porcelain-coated steel substrate.

The reason for the precipitous drop in resistance for the porcelain substrate in comparison to the alumina is that the lead oxide glass is absorbed into the porcelain during firing. This leaves the resistor film deficient in insulating barriers of glass. Hence, the fifty-fold reduction in resistance. It is clear from this comparison that the lead-borosilicate glasses are incompatible with porcelain-coated metal substrates.

COMPARATIVE EXAMPLE B

Ruthenium resistor inks were prepared in accordance with the method of Example 1 utilizing the formulation of Comparative Example A containing the following glass frits.

| Ingredient | Glass Frit | |
| --- | --- | --- |
| (Percent) | A | B |
| Barium Oxide | 52 | 48 |
| Calcium Oxide | 12 | 8 |
| Boron Trioxide | 16 | 23 |
| Silicon Dioxide | 20 | 21 |

Frit A is representative of the glass frits of this invention. Frit B represents the formulations in U.S. Pat. No. 4,172,922 (Example 1), and No. 4,215,020 (Example III) having the highest disclosed calcium oxide content, 7.7 percent and 8 percent, respectively.

The inks were screened onto porcelain-coated steel substrates of the type described by Hang et al. and fired in air according to the procedure of Example 1. Conductor terminations had been initially applied and fired. The sheet resistivity was determined to be 78.52 kilo-ohm per square for frit A and 212.84 kilo-ohm per square for Frit B. It is significant that a reduction in calcium oxide content of one-third from Frit A to Frit B causes a nearly three fold increase in the resistance. It can be seen, therefore, that for a given glass content in an air-fireable resistor ink, it is necessary that the calcium oxide concentration be at least about 10 percent by weight in order to obtain low resistance values.

We claim:

1. In an air-fireable conductor or resistor ink suitable for forming a film on a porcelain-coated metal circuit board comprising from about 2 to about 90 percent by weight of a functional component, from about 1 to about 80 percent by weight of a glass frit and from about 8 to about 35 percent by weight of a suitable organic vehicle, wherein the functional component in the resistor ink is ruthenium dioxide and the functional component in the conductor ink is a precious metal in combination with bismuth oxide, wherein bismuth oxide is present in admixture with the precious metal or as a component of the glass;

the improvement wherein the glass frit consists of from about 40 to about 55 percent by weight of barium oxide, from about 10 to about 15 percent by weight of calcium oxide, from about 14 to about 25 percent by weight of boron trioxide, and from about 13 to about 23 percent by weight of silicon dioxide.

2. An improved air-fireable resistor ink in accordance with claim 1 comprising:
(a) from about 2 to about 60 percent by weight of ruthenium dioxide;
(b) from about 25 to about 80 percent by weight of said glass frit; and
(c) from about 10 to about 35 percent by weight of said vehicle.

3. An improved air-fireable resistor ink in accordance with claim 2, wherein said glass frit consists of about 52 percent by weight of barium oxide, about 12 percent by weight of calcium oxide, about 16 percent by weight of boron trioxide, and about 20 percent by weight of silicon dioxide.

4. An improved air-fireable resistor ink in accordance with claim 2, wherein said ink comprises from about 5 to about 25 percent by weight of ruthenium dioxide, from about 50 to about 75 percent by weight of said glass, and from about 20 to about 30 percent by weight of said vehicle.

5. An improved air-fireable resistor ink in accordance with claim 2, wherein said ink contains up to about 10 percent by weight of a temperature coefficient of resistance modifier selected from the group consisting of manganese dioxide, cadmium oxide, and cuprous oxide.

6. An improved air-fireable conductor ink in accordance with claim 1 comprising:
(a) from about 60 to about 90 percent by weight of a precious metal powder;
(b) from about 1 to about 15 percent by weight of said glass;
(c) from about 1 to about 15 percent by weight of bismuth oxide; and
(d) from about 8 to about 30 percent by weight of said vehicle.

7. An improved air-fireable conductor ink in accordance with claim 6, wherein said ink comprises: from about 70 to about 85 percent by weight of said precious metal; from about 1 to about 7 percent by weight of said glass; from about 1 to about 7 percent by weight of bismuth oxide; and from about 10 to about 25 percent by weight of said vehicle.

8. An improved air-fireable conductor ink in accordance with claim 6, wherein said glass consists of about 52 percent by weight of barium oxide, about 12 percent by weight of calcium oxide, about 19 percent by weight of boron trioxide, and about 17 percent by weight of silicon dioxide.

9. An improved air-fireable conductor ink in accordance with claim 6, wherein said precious metal is selected from the group consisting of gold, silver, platinum, palladium rhodium, and mixtures thereof.

10. An improved air-fireable conductor ink in accordance with claim 6, wherein said precious metal is gold.

11. An improved air-fireable conductor ink in accordance with claim 6, wherein said precious metal is a mixture of gold and platinum.

12. An air-fireable ink in accordance with claim 6, wherein said precious metal is a mixture of silver and palladium.

13. An improved air-fireable conductor ink in accordance with claim 6, wherein said precious metal is a mixture of silver, palladium, and platinum.

14. An improved air-fireable conductor ink in accordance with claim 6, wherein the weight ratio of bismuth oxide to glass is from about 3:1 to about 1:3.

15. In an assembly comprising a porcelain-coated metal circuit board having on a portion of the surface thereof a coating of an air-fireable conductor or resistor ink comprising from about 2 to about 90 percent by weight of a functional component, from about 1 to about 80 percent by weight of a glass frit and from about 8 to about 35 percent by weight of a suitable organic vehicle, wherein the functional component in the resistor ink is ruthenium dioxide and the functional component in the conductor ink is a precious metal in combination with bismuth oxide, wherein bismuth oxide is present in admixture with the precious metal or as a component of the glass, the improvement wherein the glass frit consists of from about 40 to about 55 percent by weight of barium oxide, from about 10 to about 15 percent by weight of calcium oxide, from about 14 to about 25 percent by weight of boron trioxide, and from about 13 to about 23 percent by weight of silicon dioxide.

16. An assembly in accordance with claim 15, said ink comprises:
(a) from about 2 to about 60 percent by weight of ruthenium dioxide;
(b) from about 25 to about 80 percent by weight of said glass frit; and
(c) from about 10 to about 35 percent by weight of said vehicle.

17. An assembly in accordance with claim 15, wherein said metal is steel.

18. An assembly in accordance with claim 15 wherein said ink comprises:
(a) from about 60 to about 90 percent by weight of said precious metal;
(b) from about 1 to about 15 percent by weight of said glass;
(c) from about 1 to about 15 percent by weight of bismuth oxide; and
(d) from about 8 to about 30 percent by weight of said vehicle.

19. An assembly in accordance with claim 18, wherein said precious metal is selected from the group consisting of gold, silver, platinum, palladium, rhodium, and mixtures thereof.

20. A process for forming a resistor or conductor film as part of a circuit on a porcelain-coated circuit board comprising applying and firing onto said board the improved ink composition of claim 1.

21. In an electronic assembly comprising a porcelain-coated metal circuit board having a circuit thereon, said circuit containing a resistor film or conductor film formed by applying and firing in air a resistor or conductor ink comprising from about 2 to about 90 percent by weight of a functional component, from about 1 to about 80 percent by weight of a glass frit and from about 8 to about 35 percent by weight of a suitable organic vehicle, wherein the functional component in the resistor ink is ruthenium dioxide and the functional component in the conductor ink is a precious metal in combination with bismuth oxide, wherein bismuth oxide is present in admixture with the precious metal or as a component of the glass,
the improvement wherein said glass frit consists of from about 40 to about 55 percent by weight of barium oxide, from about 10 to about 15 percent by weight of calcium oxide, from about 14 to about 25 percent by weight of boron trioxide, and from about 13 to about 23 percent by weight of silicon dioxide.

22. An electronic assembly in accordance with claim 21, wherein said ink is a resistor ink, said functional component is ruthenium dioxide and said ink comprises:
(a) from about 2 to about 60 percent by weight of ruthenium dioxide;
(b) from about 25 to about 80 percent by weight of said glass frit; and
(c) from about 10 to about 35 percent by weight of said vehicle.

23. An electronic assembly in accordance with claim 21, wherein said ink comprises:
(a) from about 60 to about 90 percent by weight of said precious metal;
(b) from about 1 to about 15 percent by weight of said glass;
(c) from about 1 to about 15 percent by weight of bismuth oxide; and
(d) from about 8 to about 30 percent by weight of said vehicle.

24. An electronic assembly in accordance with claim 23, wherein said precious metal is selected from the group consisting of gold, silver, platinum, palladium, rhodium, and mixtures thereof.

* * * * *